(12) United States Patent
Sun et al.

(10) Patent No.: US 11,482,694 B2
(45) Date of Patent: Oct. 25, 2022

(54) DISPLAY PANEL, METHOD FOR FABRICATING THE SAME, AND DISPLAY DEVICE

(71) Applicant: BOE Technology Group Co., Ltd., Beijing (CN)

(72) Inventors: Tao Sun, Beijing (CN); Song Zhang, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 102 days.

(21) Appl. No.: 17/146,652

(22) Filed: Jan. 12, 2021

(65) Prior Publication Data
US 2021/0135160 A1    May 6, 2021

Related U.S. Application Data

(63) Continuation-in-part of application No. 16/149,707, filed on Oct. 2, 2018, now Pat. No. 10,896,935.

(30) Foreign Application Priority Data

Oct. 25, 2017    (CN) .......................... 201711008141.8

(51) Int. Cl.
| | | |
|---|---|---|
| H01L 51/52 | (2006.01) | |
| H01L 27/32 | (2006.01) | |
| H01L 51/56 | (2006.01) | |
| H01L 51/00 | (2006.01) | |

(52) U.S. Cl.
CPC ...... *H01L 51/5253* (2013.01); *H01L 27/3234* (2013.01); *H01L 27/3246* (2013.01); *H01L 51/0097* (2013.01); *H01L 51/56* (2013.01)

(58) Field of Classification Search
CPC ............ H01L 51/5253; H01L 27/3234; H01L 27/3246; H01L 51/0097; H01L 51/56
See application file for complete search history.

(56) References Cited

U.S. PATENT DOCUMENTS

2018/0342700 A1*  11/2018  Cai .................... H01L 51/5206

* cited by examiner

*Primary Examiner* — Shahed Ahmed
*Assistant Examiner* — Vicki B. Booker
(74) *Attorney, Agent, or Firm* — ArentFox Schiff LLP; Michael Fainberg

(57) ABSTRACT

The disclosure relates to a display panel, a method for fabricating the same, and a display device. The display panel includes: a base substrate including a first base substrate in a blind hole area and a second base substrate, the thickness of the first base substrate is smaller than the thickness of the second base substrate; an anode layer, a light-emitting layer, a cathode layer and an encapsulation layer arranged successively on the second base substrate, and the cathode layer and the encapsulation layer arranged successively on the first base substrate; wherein at least one installation hole is arranged in a display area of the display panel, the at least one installation hole is within the blind hole area and runs through the first base substrate and the respective layers on the first base substrate.

18 Claims, 10 Drawing Sheets

DISPLAY PANEL, METHOD FOR FABRICATING THE SAME, AND DISPLAY DEVICE

CROSS-REFERENCES TO RELATED APPLICATIONS

This application is continuation-in-part of U.S. patent application Ser. No. 16/149,707, filed on Oct. 2, 2018, which claims priority to Chinese patent application No. 201711008141.8 filed on Oct. 25, 2017, which is incorporated herein by reference in its entirety.

FIELD

The present disclosure relates to the field of display technologies, and particularly to a display panel, a method for fabricating the same, and a display device.

BACKGROUND

At present, a flexible display component is typically an Organic Light-Emitting Diode (OLED) component easy to be flexible, and a large number of flexible OLED components are being applied to mobile phones, tablet computers, and other smart terminal products. Since it is convenient to customize the form factor of the flexible OLED component, more and more terminal manufacturers have applied it to all-screen and no-bezel products. Since a larger light-emitting area is required for the all-screen and no-bezel products, it is typical in a real application to arrange installation holes on a flexible organic light-emitting diode display to reserve installation positions of a front camera, a headphone, a start button, and other hardware components on a terminal. It is common in the related art to arrange the installation holes in another area than a valid display area, which may limit the size of the valid display area, and hinder an all-screen product from being fabricated.

SUMMARY

In an aspect, an embodiment of the disclosure provides a display panel. The display panel includes: a base substrate including a first base substrate in a blind hole area and a second base substrate in an area other than the blind hole area, wherein a thickness of the first base substrate is smaller than a thickness of the second base substrate is smaller than a thickness of the second base substrate; an anode layer, a light-emitting layer, a cathode layer and an encapsulation layer arranged successively on the second base substrate, and the cathode layer and the encapsulation layer arranged successively on the first base substrate; wherein at least one installation hole for installing a hardware structure is arranged in a display area of the display panel, the at least one installation hole is within the blind hole area, and the at least one installation hole runs through the first base substrate and the respective layers on the first base substrate in a direction perpendicular to the base substrate; and wherein the encapsulation layer on the first base substrate and the encapsulation layer on the second base substrate are continuous, and the cathode layer on the first base substrate is disconnected from the cathode layer on the second base substrate; the encapsulation layer covers the respective layers on the first base substrate and the second base substrate.

In another aspect, an embodiment of the disclosure further provides a display device, which includes the above display panel.

In further aspect, an embodiment of the disclosure further provides a method for fabricating the display panel. The method includes: forming a base substrate; forming a first base substrate in a blind hole area by removing a part of the base substrate in the blind hole area in an etching process, wherein the base substrate in an area other than the blind hole area is a second base substrate, a thickness of the first base substrate is smaller than a thickness of the second base substrate; forming an anode layer and a light-emitting layer successively on the second base substrate; forming a cathode layer on the first base substrate and the second base substrate, wherein the cathode layer on the first base substrate is disconnected from the cathode layer on the second base substrate; forming an encapsulation layer on the cathode layer to enable the encapsulation layer covers the respective layers on the first base substrate and the second base substrate, wherein the encapsulation layer on the first base substrate and the encapsulation layer on the second base substrate are continuous; and etching respective layers on the first base substrate and the first base substrate in an installation hole area in a direction perpendicular to the base substrate to form an installation hole for installing a hardware structure; wherein an orthographic projection of the installation hole on the first base substrate lies within the blind hole area.

DETAILED DESCRIPTION

Figure 1:
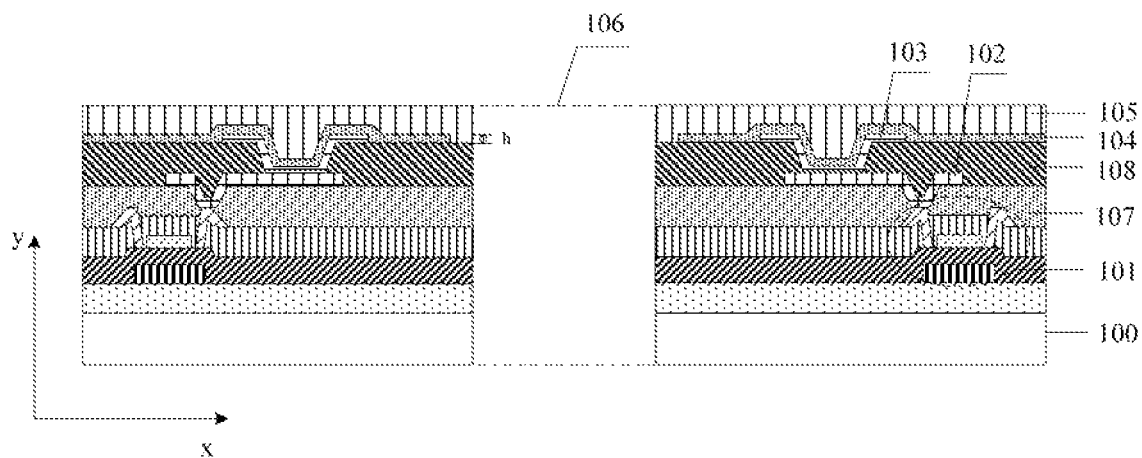
FIG. 1 is a schematic structural diagram of a first display panel according to an embodiment of the disclosure in a sectional view.

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

The thicknesses of layers, and the shapes of areas in the drawings are not intended to reflect any real proportion, but only intended to illustrate the disclosure of the disclosure.

The disclosure provides a display panel, a method for fabricating the same, and a display device, so as to address at least partially the problem in the related art that installation holes are arranged in a non-display area of the display panel, resulting in limiting the size of a valid display area, and hindering an all-screen product from being fabricated.

A display panel according to an embodiment of the disclosure generally relates to an all-screen display panel without any bezel, but also can be applicable to an ordinary display with a (narrow) bezel. In the embodiment of the disclosure, an encapsulation layer material is arranged around an installation hole for installing a hardware structure in the existing display panel to cover at least a light-emitting layer and a cathode layer adjacent to the edge of the installation hole so as to protect the light-emitting layer and the cathode layer from being oxidized by ambient water and oxygen, thus improving the reliability at the position of the installation hole. Accordingly the inventive structure can be applicable to any display panel structure in which a hole is arranged on the display panel, and a particular structure of the display panel will be described below in details.

FIG. 1 shows a schematic structural diagram of a first display panel according to an embodiment of the disclosure in a sectional view. The display panel includes: a base substrate 100, and a Thin Film Transistor (TFT) structure 101, an anode layer 102, a light-emitting layer 103, a cathode layer 104, and an encapsulation layer 105, which are arranged successively on the base substrate 100, where at least one installation hole 106 for installing a hardware structure is arranged in a display area of the display panel; the installation hole 106 runs through the base substrate 100 and the layers on the display panel in the direction perpendicular to the base substrate; the installation hole 106 is provided with an encapsulation layer material on the edge thereof; and the encapsulation layer material covers at least the light-emitting layer 103 and the cathode layer 104 adjacent to the edge of the installation hole in the direction parallel to the base substrate.

In a specific implementation, the embodiment of the disclosure is generally applicable to an all-screen display panel without any bezel, and an OLED display panel includes at least a base substrate 100, and a Thin Film Transistor (TFT) structure 101 (i.e., the structure circled in elliptic dotted lines as illustrated), an anode layer 102, a light-emitting layer 103, a cathode layer 104, and an encapsulation layer 105, which are arranged successively on the base substrate 100. Furthermore the OLED display panel further includes some other layers, e.g., a planarization layer, a passivation layer, etc., although the embodiment of the disclosure will not be limited thereto. Since the installation hole may be arranged in the display area of the display panel in the embodiment of the disclosure, that is, the hardware structure to be installed may be installed in the display area, therefore a bezel may be reduced to thereby increase the valid size of the display area so as to fabricate the all-screen display. The rectangular area 106 in FIG. 1 located at the middle and circled in the dotted line is the position of the installation hole, and the installation hole formed through cutting runs through the base substrate 100 and the other layers in the direction perpendicular to the base substrate (i.e., in the direction of y axis as illustrated), thus resulting in the structure as illustrated in FIG. 1. Of course, the installation hole can alternatively be arranged as needed to run through only the functional layers on the display panel, that is, the installation hole can run through the other layers than the base substrate in the direction of y axis. The specific components through which the installation hole runs can be set as needed, although the embodiment of the disclosure will not be limited thereto.

Furthermore in the display panel according to the embodiment of the disclosure, the encapsulation layer material is arranged on the surrounding edge of the installation hole 106, the encapsulation layer material has a preset h, and the size of the preset thickness can be selected as needed in reality, and is at least the smallest thickness capable of protecting a light-emitting layer and a cathode layer from being oxidized by ambient water and oxygen. Of course, these encapsulation layer material is an encapsulation layer material reserved at the position of the edge after the installation hole to be fabricated is formed, while in the related art the light-emitting layer or electrode layer is bare; and in the disclosure, the reserved encapsulation layer material with the preset thickness covers at least a light-emitting layer and a cathode layer adjacent to the edge of the installation hole in the direction parallel to the base substrate, i.e., covers at least the closest light-emitting layer and cathode layer close to the installation hole, and thus can protect the light-emitting layer and the cathode layer from being oxidized by ambient water and oxygen, so as to improve the reliability at the position of the installation hole. The display panel according to the embodiment of the disclosure can increase effectively the valid size of the display area in the display panel, and narrow the bezel to thereby fabricate the all-screen display panel.

As illustrated in FIG. 1, the cathode layer is closer to the edge of the installation hole, but the light-emitting layer is farther from the edge of the installation hole, so the encapsulation layer material with the preset thickness really only covers the closest cathode layer to the installation hole. When the diameter of the installation hole is so large that the installation hole is adjacent to the light-emitting layer and the cathode layer, then the encapsulation layer material with the preset thickness may cover the closest light-emitting layer and cathode layer to the installation hole.

In a specific implementation, the encapsulation layer material can cover another organic material layer(s) in addition to the light-emitting layer 103 and the cathode layer 104 adjacent to the edge of the installation hole. In some embodiments, the display panel further includes a planarization layer 107 arranged between the TFT structure 101 and the anode layer 102, and a pixel definition layer 108 arranged between the anode layer 102 and the light-emitting layer 103; and the encapsulation layer material covers the planarization layer 107 and the pixel definition layer 108 adjacent to the edge of the installation hole.

Figure 2:
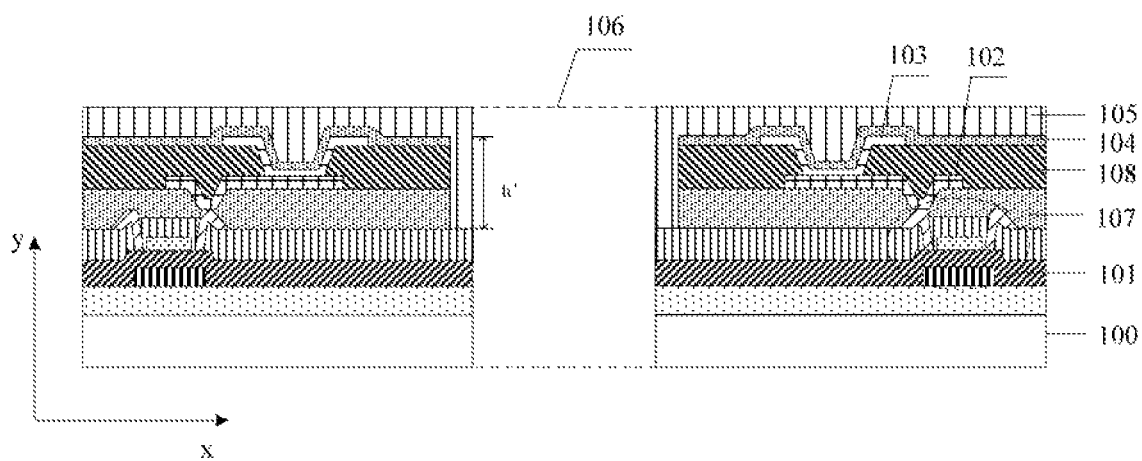
FIG. 2 is a schematic structural diagram of a second display panel according to an embodiment of the disclosure in a sectional view.

In order to better protect the organic material layer(s) around the installation hole, the number of layers covered by the encapsulation layer material at the position of the edge of the installation hole can be further increased so that the planarization layer and the pixel definition layer can be covered in addition to the light-emitting layer and the cathode layer. Alternatively, the encapsulation layer material may cover only the light-emitting layer, the cathode layer, and the planarization layer as needed, and the value of the preset thickness and the coverage range can be set as needed. As illustrated in FIG. 2 which is a schematic structural diagram of a second display panel according to an embodiment of the disclosure in a sectional view. The preset thickness h' of the encapsulation layer material as illustrated is more than h, so the encapsulation layer material may cover the closest light-emitting layer, cathode layer, planarization layer, and pixel definition layer, so that after the installation hole is formed through cutting, the encapsulation layer material can protect these layers from being oxidized from ambient water and oxygen, to thereby improve the reliability at the position of the installation hole.

In a real process of fabricating the display panel, the positions at which to arrange hardware structures, and the sizes and shapes of installation holes to be formed through cutting are determined according to a product for which the display panel is to be fabricated. For an area in which to form an installation hole, a TFT structure, the light-emitting layer, the anode layer, or other structures may not be arranged in the area; or, the TFT structure, the light-emitting layer, the anode layer, or other structures may be arranged in the area, but when a cutting process is performed, the edge of the installation hole is located between two TFT structures as much as possible so as not to influence the display effect of the display panel; or, in order not to cut a TFT structure when the installation hole is being formed through cutting, i.e., a TFT structure at the position of the edge of the installation hole to be formed through cutting, the spacing between two adjacent TFT structures may be increased, and they are not electrically connected with each other.

In any one of the instances above, the position of the installation hole to be formed through cutting shall have an influence on normal display on the display panel as few as possible. In some embodiments, there are preset distances between the edge of the installation hole and an adjacent TFT structure, and between the edge of the installation hole and the anode layer, and both of the preset distances are no more than the distance between adjacent sub-pixels. As illustrated in FIG. 1 and FIG. 2, there is some distance between the edge of the installation hole, and the closest TFT structure, and there is some distance between the edge of the installation hole and the closest anode layer, and in order not to influence the normal display of the display panel, these distances shall not be more than the spacing between adjacent sub-pixels.

Figure 3:
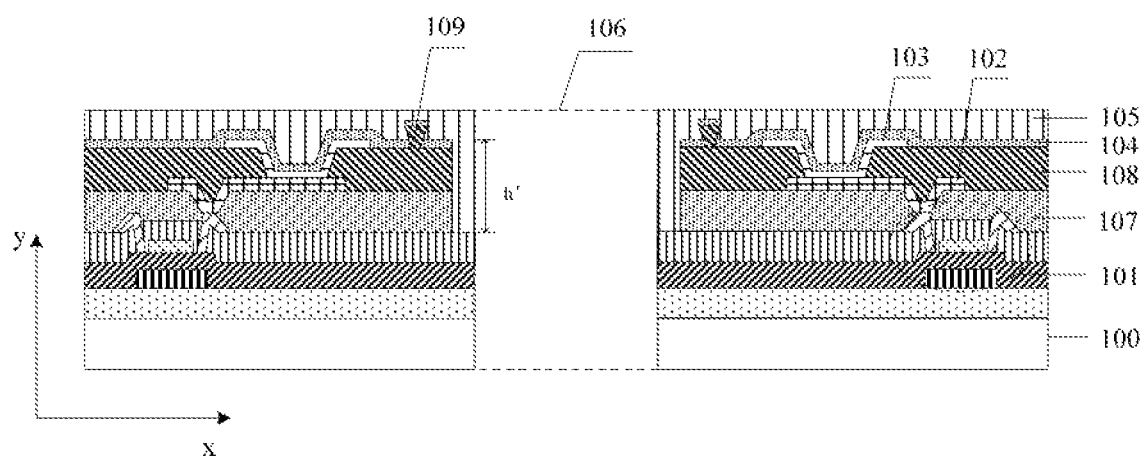
FIG. 3 is a schematic structural diagram of a third display panel according to an embodiment of the disclosure in a sectional view.

In order to prevent the light-emitting layer adjacent to the edge of the installation hole from being cut when the installation hole is being formed through cutting, in some embodiments, the display panel further includes: post spacers 109 arranged at the same layer as the light-emitting layer 103, where the post spacers 109 surround the installation hole 106, and the post spacers are arranged between the edge of the installation hole 106 and the light-emitting layer 103. As illustrated in FIG. 3 which is a schematic structural diagram of a third display panel according to an embodiment of the disclosure in a sectional view, the post spacers 109 are arranged at the same layer as the light-emitting layer 103, that is, lower surfaces of the post spacers 109 are located as same surface as the lower surface of the light-emitting layer 103, and the post spacers 109 are arranged between the edge of the installation layer 106 and the light-emitting layer 103, so that the post spacers can protect the light-emitting layer and the cathode layer when the installation hole is being formed through cutting, to thereby prevent excessive etching in a dry etching process, which would otherwise result in poor light emission on the edge.

Furthermore in order to better protect the cathode layer and the light-emitting layer, the heights of the post spacers can be set higher. In some embodiments the heights of the post spacers in the direction perpendicular to the base substrate are no less than the sum of the thicknesses of the light-emitting layer and the cathode layer. For example, the heights of the post spacers in the direction perpendicular to the base substrate (i.e., in the direction of y axis) range from 1 to 10 micrometers. The post spacers have their lower surfaces arranged at the same surface as the lower surface of the light-emitting layer, and their heights are no less than the sum of the thicknesses of the light-emitting layer and the cathode layer; and for example, the heights of the post spacers can be set higher than the cathode layer in the structure as illustrated in FIG. 3, and in this manner, the post spacers can prevent the light-emitting layer adjacent to the edge of the installation hole from being cut, but also can support the display panel when the display panel is impacted, to thereby protect the cathode layer and the light-emitting layer.

Figure 4:
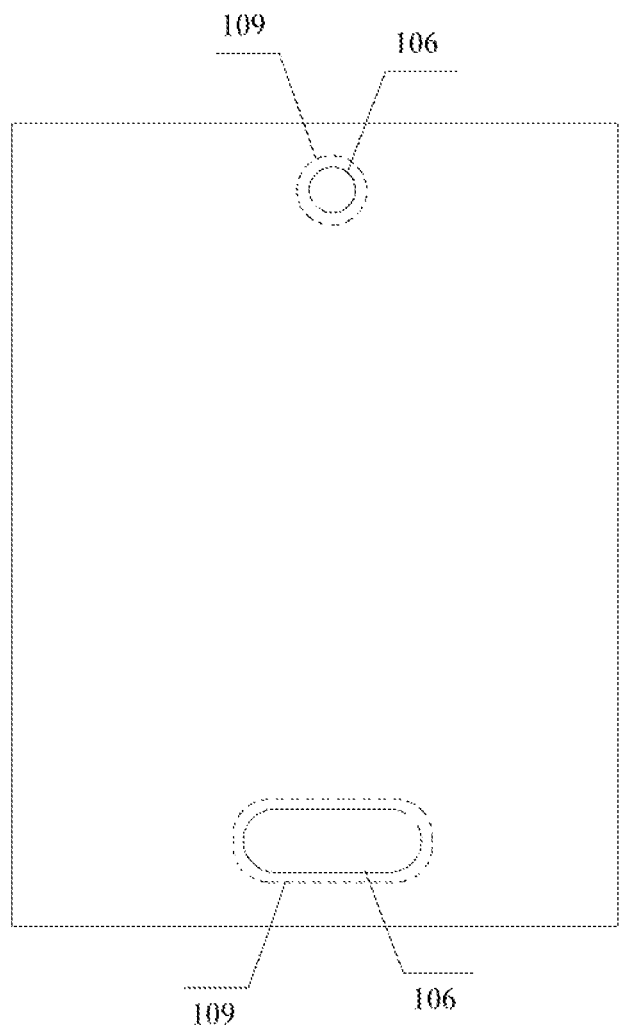
FIG. 4 is a schematic structural diagram of a display panel according to an embodiment of the disclosure in a top view.

In a specific implementation, the post spacers are arranged around the installation hole 106, and as illustrated in FIG. 4 which is a schematic structural diagram of a display panel according to an embodiment of the disclosure in a top view. FIG. 4 is a top view of FIG. 3, where both the dotted circle around the upper installation hole 106 and the dotted ellipse around the lower installation hole 106 represent the post spacers 109 surrounding the installation holes, and the shapes of their sections along the direction of x axis in FIG. 3 are the same as or the similar type as the shapes of the installation holes 106. For example, the post spacers 109 in the dotted circle and the dotted ellipse in FIG. 4 have the same shapes of their corresponding installation holes.

The material of the post spacers can be selected as needed, although the embodiment of the disclosure will not be limited thereto. The post spacers can be fabricated in a separate process, or in order to simplify the fabrication process, they can be fabricated together with another layer. In some embodiments the display panel further includes: a pixel definition layer arranged between the anode layer 102 and the light-emitting layer 103; and spacers arranged between the pixel definition layer 108 and the cathode layer 104 and between adjacent sub-pixel elements. In this manner, a part of the post spacers are arranged at the same layer as the pixel definition layer 108, and/or a part of the post spacers are arranged at the same layer as the spacer. That is, lower surfaces of a part of the post spacers are located as the lower surface of the pixel definition layer 108, and/or lower surfaces of a part of the post spacers are located as the lower surface of the spacer.

In a specific implementation, the spacers are generally arranged between adjacent sub-pixel elements although they are not illustrated, and the post spacers can be made of the same material as the spacers, and fabricated in the same etching process. The post spacers are arranged above the pixel definition layer, so they can alternatively be made of the same material as the pixel definition layer, and fabricated in the same etching process. Alternatively a part of the post spacers can be arranged at the same layer as the pixel definition layer, and the other part of the post spacers can be arranged at the same layer as the spacer.

In a specific implementation, the cathode layer is arranged above the light-emitting layer and is fabricated as a whole layer, and the heights of the post spacers are higher than the thickness of the cathode layer, thus when the cathode layer is fabricated, a part of the cathode layer material may also be arranged above the post spacers, as illustrated in FIG. 3. In order not to hinder the function of the cathode layer, the cathode layer material located above the post spacers shall be disconnected from the integral cathode layer, and become not operational while an image is being displayed. In view of this, the post spacers shall be arranged avail for the cathode layer material to be disconnected, and in some embodiments the shapes of sections of the post spacers in the direction perpendicular to the base substrate are one or more of an upside-down trapezium, a pattern where the portions of the post spacers close to the base substrate have a sharp angle, or another irregular pattern where the widths of top sides of the post spacers in the direction of y axis are more than the widths of bottom sides thereof as long as the cathode layer material can be disconnected. For example, there may be an upside-down structure with a wider top side than a bottom side as illustrated in FIG. 3, where the height of the structure is more than the height of the light-emitting layer in the display panel. Of course, the cathode layer material arranged above the post spacers can alternatively be removed as needed so as not to affect the integral cathode layer, although the embodiment of the disclosure will not be limited thereto. The widths of the sections of the post spacers, etc., can also be set as needed in reality, for example, according to the distances between the edge of the hole and the light-emitting layer, and between the edge of the hole and the cathode layer, etc.

Here the installation hole above is an area where a hardware structure is to be installed, and for the sake of a convenient description, it has been referred to as an installation hole in the embodiment of the disclosure, although the embodiment of the disclosure will not be limited thereto, and it can be referred to otherwise, e.g., a via-hole, a groove, an opening, etc. In some embodiments, the hardware structure includes one or more of a front camera, a button, a headphone, or a loudspeaker. The hardware structure will not be limited to any specific installation scheme, although the embodiment of the disclosure will not be limited thereto. Furthermore in order to form the installation hole through cutting, the shape of the installation hole to be formed through cutting can be determined according to the hardware structure to be installed, and the installation hole can be different shapes for the different hardware structure. In some embodiments, the shape of a section of the installation hole in the direction parallel to the base substrate can be one or more of the following shapes: a circle, an ellipse, a rectangle, a trapezium, a diamond, or a square.

In a specific implementation, the structure of the encapsulation layer above may not be limited to any specific structure. For example, the encapsulation layer can be arranged in a structure of three layers stacked, i.e., a first inorganic layer, a second organic layer, and a third inorganic layer. Of course, the encapsulation layer can alternatively be arranged in more layers stacked. The inorganic layer in the encapsulation layer can be silicon nitride, silicon oxynitride, silicon oxide, and alumina; and the organic layer in the encapsulation layer can be Acrylic, epoxy resin, and an organic compound including silicon.

Based upon the same inventive idea, an embodiment of the disclosure further provides a display device including the display panel above according to any one of the embodiments above of the disclosure. Reference can be made to the display panel according to any one of the embodiments above of the disclosure for an implementation of the display device, so a repeated description thereof will be omitted here.

Figure 5:
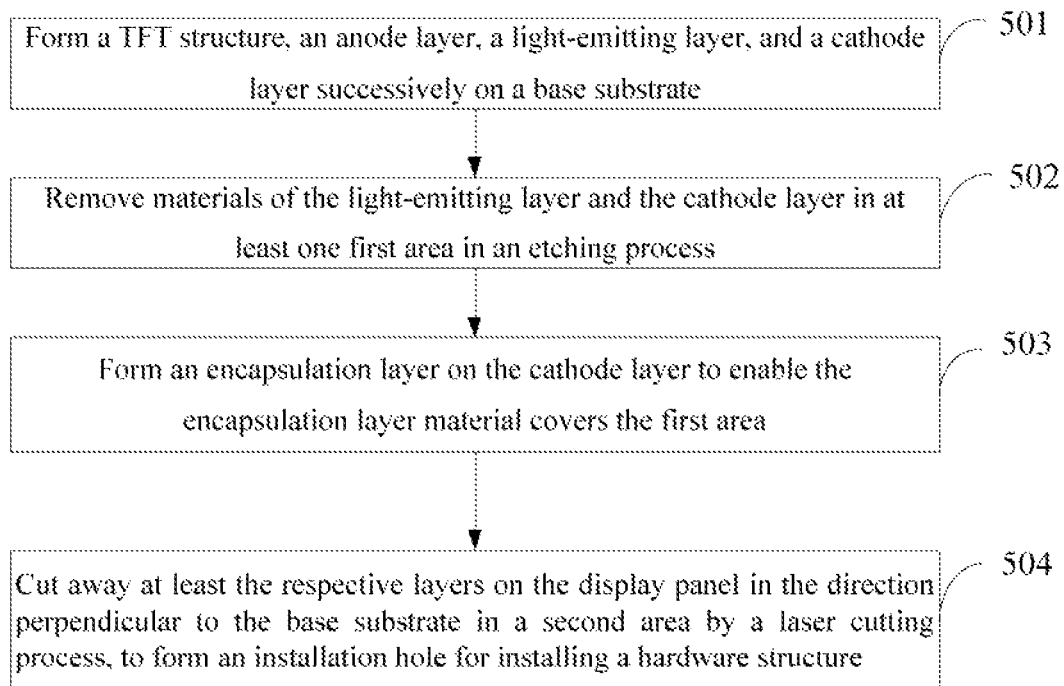
FIG. 5 is a flow chart of steps in a method for fabricating a display panel according to an embodiment of the disclosure.

Based upon the same inventive idea, an embodiment of the disclosure further provides a method for fabricating a display panel, which is the display panel above according to any one of the embodiments above of the disclosure. As illustrated in FIG. 5 which is a flow chart of steps in a method for fabricating a display panel according to an embodiment of the disclosure, the method can include the following steps.

The step 501 is to form a TFT structure, an anode layer, a light-emitting layer, and a cathode layer successively on a base substrate.

The step 502 is to remove materials of the light-emitting layer and the cathode layer in at least one first area in an etching process.

The step 503 is to form an encapsulation layer on the cathode layer to enable an encapsulation layer material covers the first area.

The step 504 is to cut away at least the respective layers on the display panel in the direction perpendicular to the base substrate in a second area by a laser cutting process, to form an installation hole for installing a hardware structure.

The shape of the second area is the same as the first area, and a positive projection of the second area onto the base substrate lies within a positive projection of the first area onto the base substrate; the edge of the installation hole is reversed with the encapsulation layer material, and the encapsulation layer material covers at least the light-emitting layer and the cathode layer adjacent to the edge of the installation hole, in a direction parallel to the base substrate. The second area is the area of the installation hole, that is, the second area is where the installation hole is located.

Figure 6A:
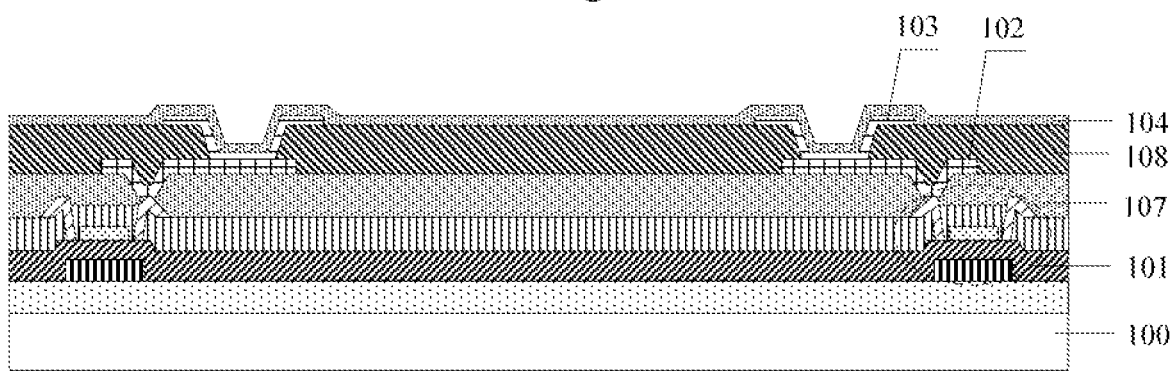
FIG. 6A to FIG. 6C are schematic structural diagrams after the respective steps in the method for fabricating a display panel according to the embodiment of the disclosure.

In a specific implementation, other layers, e.g., a passivation layer, a planarization layer, etc., shall be formed on the base substrate in addition to the TFT structure, the anode layer, the light-emitting layer, and the cathode layer, and all of these structures are common in the display panel; and since they are not a focus of the disclosure, a detailed description thereof will be omitted here. The embodiment of the disclosure will not be limited to any specific process for forming the TFT structure, the anode layer, the light-emitting layer, and the cathode layer on the flexible substrate, but an appropriate process can be selected as needed. Stated otherwise, the structure as illustrated in FIG. 6A can be formed after the step 501 is performed. Since the respective layers in the middle area on the display panel shall be cut away to form the installation hole, some layers in the area of the installation hole to be formed may not be fabricated, e.g., the TFT structure, the anode layer, etc.

Figure 6B:
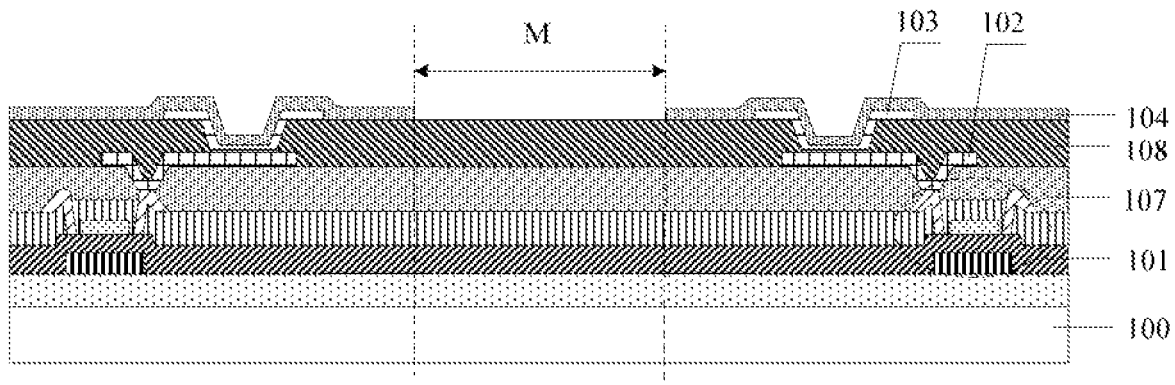

In order to enable the encapsulation layer material with the preset thickness to be reserved on the edge of the installation hole after the installation hole is formed through cutting, some improvement shall be made to the fabrication process so that the step 502 is performed in such a way that a first area M is pre-selected on the display panel, and the materials of the light-emitting layer and the cathode layer in at least one first area M are removed, that is, the structure as illustrated in FIG. 6B can be formed after the step 502 is performed. Since there is only the cathode layer in the first area M in the structure as illustrated in FIG. 6A, only the cathode layer is removed at this time, thus forming the structure as illustrated in FIG. 6B.

Figure 6C:
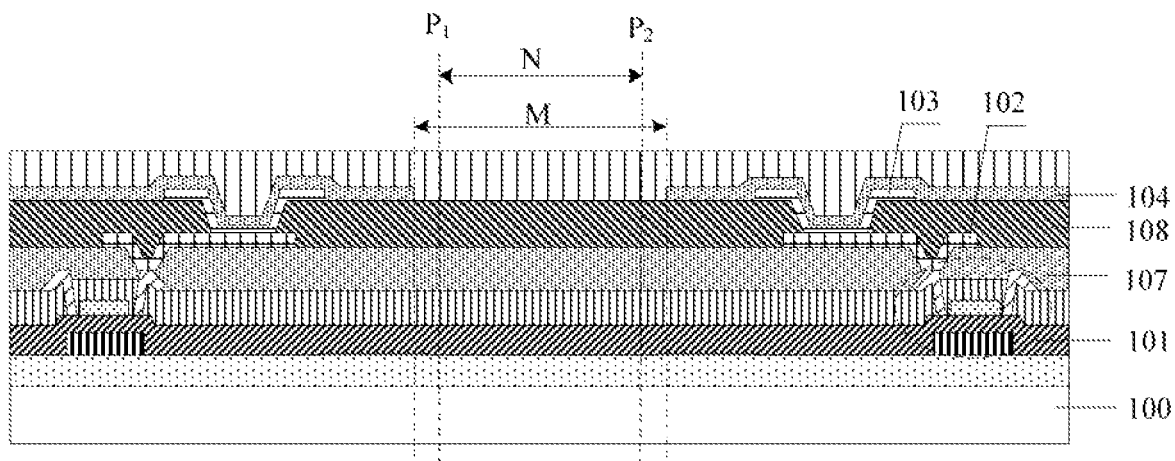

Here the shape of the selected first area is the same as the shape of the installation hole to be formed (i.e., the shape of the second area), and at least in a similar pattern to that of the installation hole, and the size of the pattern of the first area is more than the size of the pattern of the installation hole (i.e., the pattern of the second area) so that the former surrounds the latter, that is, the size of the first area can be more than the size of the hardware structure to be installed the installation hole by at least approximately 100 micrometers, that is, as illustrated in FIG. 6C, N is the second area, the materials can be cut along dotted cut lines $P_1$ and $P_2$ (i.e., the pattern of the second area) as illustrated to form the installation hole, and the diameter of the installation hole formed through cutting is less than the width of the first area M. Optionally the centers of the two areas coincide, that is, as long as the positive projection of the installation hole (i.e., the second area) onto the base substrate lies within the positive projection of the first area onto the base substrate so that after the installation hole is formed through cutting, the edge of the installation hole is reversed with the encapsulation layer material with some thickness.

Thereafter the integral encapsulation layer is formed on the cathode layer so that the encapsulation layer material can completely cover the first area, that is, the structure as illustrated in FIG. 6C can be formed after the step 503 is performed. In the embodiment of the disclosure, before an encapsulation process, the light-emitting layer and the cathode layer at the position of the installation hole to be formed through cutting can be removed in a dry etching process, and for example, the dry etching process can be performed using a plasma-enhanced chemical vapor deposition etching device, or an inductively coupled plasma etching device. Etching gas can be oxygen-containing gas which can react with an organic layer and an electrode, e.g., $O_2$, $N_2O$, $CO_2$, etc., or the etching gas can include both oxygen-containing gas and inert gas $N_2$.

After the encapsulation layer is fabricated, the installation hole can be formed through cutting in the step 504 where at least the respective layers on the display panel are cut away in the direction perpendicular to the base substrate in the second area by a laser cutting process to form the installation hole for installing the hardware structure, that is, the layers can be cut along the cut lines $P_1$ and $P_2$ to form the installation hole. Specifically the respective layers at the position of a central opening of a mask can be etched away using the mask while the other parts are being shielded, where the position of the opening of the mask is the same as the position of the installation hole to be formed on the display panel. Further the encapsulation layer material can be reserved on the edge of the formed installation hole, where the encapsulation layer material covers at least the light-emitting layer and the cathode layer adjacent to the edge of the installation hole in the direction parallel to the base substrate. Stated otherwise, the structure as illustrated in FIG. 1 can be formed after the step 504 is performed.

Figure 7:
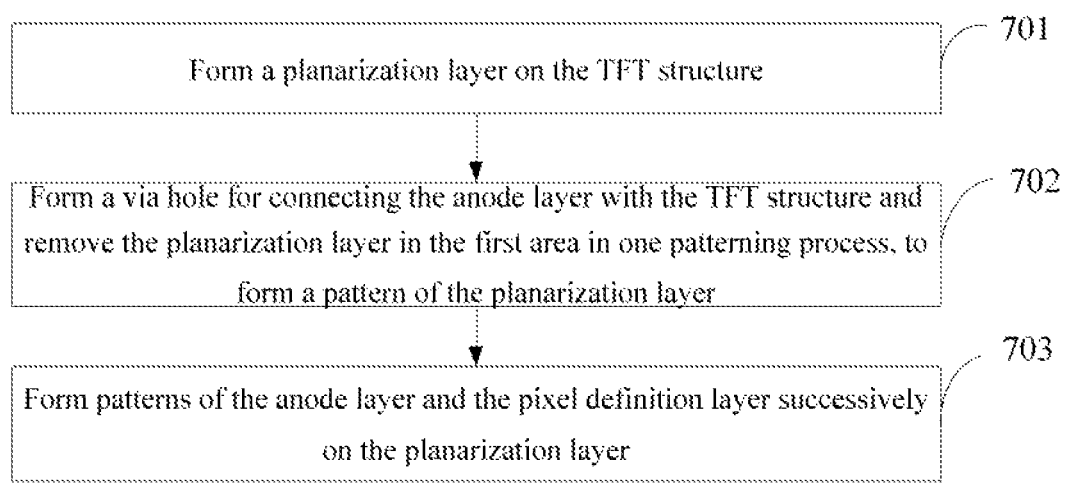
FIG. 7 is a flow chart of steps in a method for fabricating a planarization layer and a pixel definition layer according to the embodiment of the disclosure.

In some embodiments, the encapsulation layer material can cover the planarization layer and the pixel definition layer in addition to the light-emitting layer and the cathode layer adjacent to the edge of the installation hole. As illustrated in FIG. 7 which is a flow chart of steps in a method for fabricating a planarization layer and a pixel definition layer according to an embodiment of the disclosure, the method can include the following steps.

After the TFT structure is formed, and before the cathode layer is formed, the method further includes the following steps.

The step 701 is to form a planarization layer on the TFT structure.

The step 702 is to form a via hole for connecting the anode layer with the TFT structure and to remove the planarization layer in the first area in one patterning process, to form a pattern of the planarization layer.

The step 703 is to form patterns of the anode layer and the pixel definition layer successively on the planarization layer.

In a specific implementation, a planarization layer is formed on the TFT structure after the TFT structure is fabricated; and in order to enable the encapsulation layer material to cover the planarization layer, the planarization layer in the first area shall be removed so that the fabricated encapsulation layer can cover the area, and the step of removing the thin planarization layer in the first area can be performed together with a process of forming the pattern of the planarization layer. Patterns of the anode layer and the pixel definition layers are further formed after the planarization layer is fabricated.

Furthermore after the planarization layer and the pixel definition layer are formed, the material of the pixel definition layer in the first area shall be removed together with the materials of the light-emitting layer and the cathode layer. Specifically in the step 502, the materials of the pixel definition layer, the light-emitting layer, and the cathode layer in at least one first area are removed in an etching process, where the encapsulation layer covers the planarization layer and the pixel definition layer adjacent to the edge of the installation hole, thus forming the structure as illustrated in FIG. 2.

In order to prevent the light-emitting layer adjacent to the edge of the installation hole from being cut while the installation hole is being formed through cutting, in some embodiments, before the cathode layer is formed, the method further includes: patterns of post spacers surrounding the second area, located outside of the second area and inside of the first area are formed, where the post spacers are located at the same layer as the light-emitting layer, that is, the lower surfaces of the post spacers are located as same surface as the lower surface of the light-emitting layer; and the heights of the post spacers in the perpendicular to the base substrate are no less than the sum of the thicknesses of the light-emitting layer and the cathode layer. While the installation hole is being formed through cutting, the post spacers can protect the light-emitting layer and the cathode layer to thereby prevent excessive etching in a dry etching process, which would otherwise result in poor light emission on the edge. Since the lower surfaces of the post spacers are arranged at the same surface as the lower surface of the light-emitting layer, and their heights are no less than the sum of the thicknesses of the light-emitting layer and the cathode layer, the post spacers can prevent the light-emitting layer adjacent to the edge of the installation hole from being cut, but also can support the display panel while the display panel is impacted, to thereby protect the cathode layer and the light-emitting layer.

The material of the post spacers can be selected as needed, although the embodiment of the disclosure will not be limited thereto. The post spacers can be fabricated in a separate process, or in order to simplify the fabrication process, they can be fabricated together with another layer. In some embodiments, after the anode layer is formed, and before the light-emitting layer is formed, the method further includes: forming the patterns of the pixel definition layer and the spacer successively. The pattern of at least one post spacer is formed together with the pattern of the pixel definition layer; and/or the pattern of at least one post spacer is formed together with the pattern of the spacer.

In a specific implementation, the spacer is generally arranged between adjacent sub-pixel elements, and the post spacers can be made of the same material as the spacer, and fabricated in the same one etching process. The post spacers are arranged above the pixel definition layer so they can alternatively be made of the same material as the pixel definition layer, and fabricated in the same one etching process. Alternatively a part of the post spacers can be arranged at the same layer as the pixel definition layer, and the other part of the post spacers can be arranged at the same layer as the spacer. They can be formed in the steps of coating, exposing, developing, and striping photoresist.

In the method for fabricating a display panel according to the embodiment of the disclosure, as in the process described above with reference to FIG. 5, the installation hole can be formed through cutting directly after the encapsulation layer is fabricated; and in order to improve the preciseness of cutting, and to avoid the light-emitting layer or the cathode layer from being cut, alternatively after the encapsulation layer is fabricated, firstly the encapsulation layer material in the second area can be removed, and then the remaining layers can be cut, thus forming the structure of the installation hole. In some embodiments, after the encapsulation layer is formed on the cathode layer, and before the installation hole for installing the hardware structure is formed, the method further includes: removing the encapsulation layer material in the second area in an etching process.

Figure 8:
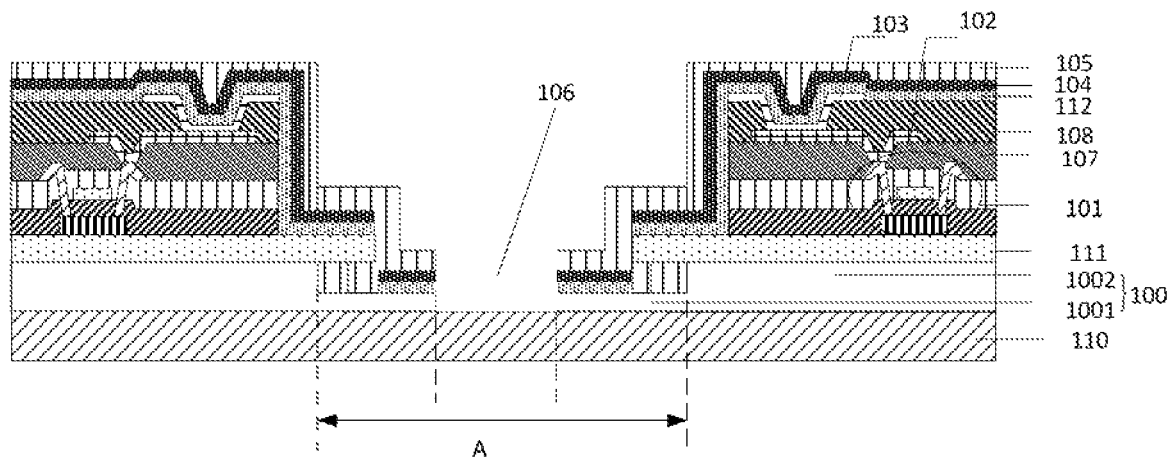
FIG. 8 is a schematic structural diagram of another display panel according to an embodiment of the disclosure in a sectional view.

FIG. 8 shows a schematic structural diagram of another display panel according to some embodiments of the disclosure in a sectional view. The display panel includes: a base substrate 100, which includes a first base substrate 1001 in a blind hole area A and a second base substrate 1002 in an area other than the blind hole area, wherein a thickness of the first base substrate 1001 is smaller than a thickness of the second base substrate 1002; an anode layer 102, a light-emitting layer 103, a cathode layer 104, and an encapsulation layer 105 arranged successively on the second base substrate 1002, and the cathode layer 104 and the encapsulation layer 105 arranged successively on the first base substrate 1001. At least one installation hole 106 for installing a hardware structure is arranged in a display area of the display panel, the at least one installation hole 106 is within the blind hole area A, and the at least one installation hole runs through the first base substrate 1001 and the respective layers on the first base substrate in a direction perpendicular to the base substrate.

The encapsulation layer 105 on the first base substrate 1001 and the encapsulation layer 105 on the second base substrate 1002 are continuous, and the cathode layer 104 on the first substrate 1001 is disconnected from the cathode layer 104 on the second base substrate 1002. The encapsulation layer 105 covers the respective layers on the first base substrate 1001 and second base substrate 1002.

In some embodiments, the display panel further includes a thin film transistor structure 101 between the anode layer 102 and the second base substrate 1002. The encapsulation layer 105 covers the TFT structure 101 on the second base substrate.

In some embodiments, the display panel further includes a function layer 112 between the cathode layer 104 and light-emitting layer 103 on the second base substrate 1002, and between the cathode layer 104 and the first base substrate 1001. The function layer on the first base substrate 1001 is disconnected from the function layer on the second base substrate 1002, wherein the encapsulation layer 105 covers the function layer on the second base substrate.

The embodiments of the disclosure are generally applicable to an all-screen display panel without any bezel, and an OLED display panel includes at least a base substrate 100, and a Thin Film Transistor (TFT) structure 101 (i.e., the structure circled in elliptic dotted lines as illustrated), an anode layer 102, a light-emitting layer 103, a cathode layer 104, and an encapsulation layer 105, which are arranged successively on the base substrate 100. Furthermore the OLED display panel further includes some other layers, e.g., a planarization layer, a passivation layer, etc., although the embodiment of the disclosure will not be limited thereto. Since the base substrate includes the first base substrate in the blind hole area and the second base substrate in the area other than the blind hole area, and the thickness of the first base substrate is smaller than the thickness of the second base substrate, the cathode layer on the first base substrate is disconnected from the cathode layer on the second base substrate, and the encapsulation layer on the first base substrate and the second base substrate is continuous, thus can protect the cathode layer on the second base substrate from being oxidized by ambient water and oxygen, so as to improve the reliability at the position of the installation hole. The display panel according to the embodiment of the disclosure can increase effectively the valid size of the display area in the display panel, and narrow the bezel to thereby fabricate the all-screen display panel.

In some embodiments, see FIG. 8, the display panel further includes a planarization layer 107 arranged between the TFT structure 101 and the anode layer 102, and a pixel definition layer 108 arranged between the anode layer 102 and the light-emitting layer 103 on the second base substrate. The encapsulation layer 105 covers the planarization layer 107 and the pixel definition layer 108 on the second base substrate.

In some embodiments, see FIG. 8, the display panel further includes a barrier layer 111 arranged on the second base substrate 1002, wherein the barrier layer 111 is between the second base substrate and the TFT structure 101, and the encapsulation layer 105 covers the barrier layer 111. In some embodiments, the boundary of the barrier layer 111 close to the first base substrate is beyond the boundary between the second base substrate and the first base substrate, and the barrier layer 111 at least overlaps with the first base substrate 1001, and the cathode layer 104 and encapsulation layer 105 are arranged on an overlapped area of the barrier layer 111 with the first base substrate 1001. See FIG. 10C, the boundary of the barrier layer 111 close to the first base substrate is beyond the boundary between the second base substrate and the first base substrate, and the distance between the two boundaries is a, and a is about 0.5 µm.

In some embodiments, there is a function layer 112 below the cathode layer 104, thus the function layer 112 and cathode layer 104 and encapsulation layer 105 are arranged on an overlapped area of the barrier layer 111 with the first base substrate 1001.

In some embodiments, see FIG. 8, the encapsulation layer 105 and cathode layer 104 cover side surface of the respective layers on the barrier layer of the second base substrate, and the encapsulation layer 105 covers the side surface of the second base substrate. In some embodiments, there is a function layer 112 below the cathode layer 104, thus the encapsulation layer 105 and cathode layer 104 and function layer 112 cover side surface of the respective layers on the barrier layer of the second base substrate.

In some embodiments, see FIG. 8, the encapsulation layer 105 covers side surface of the barrier layer 111 and cathode layer 104 on the overlapped area between the barrier layer and the first base substrate and doesn't cover the side surface of the first base substrate. In some embodiments, there is a function layer 112 below the cathode layer 104 on the first base substrate and the second base substrate. Thus, the encapsulation layer 105 also covers side surface of the function layer 112 on the overlapped area between the barrier layer and the first base substrate.

Figure 11:
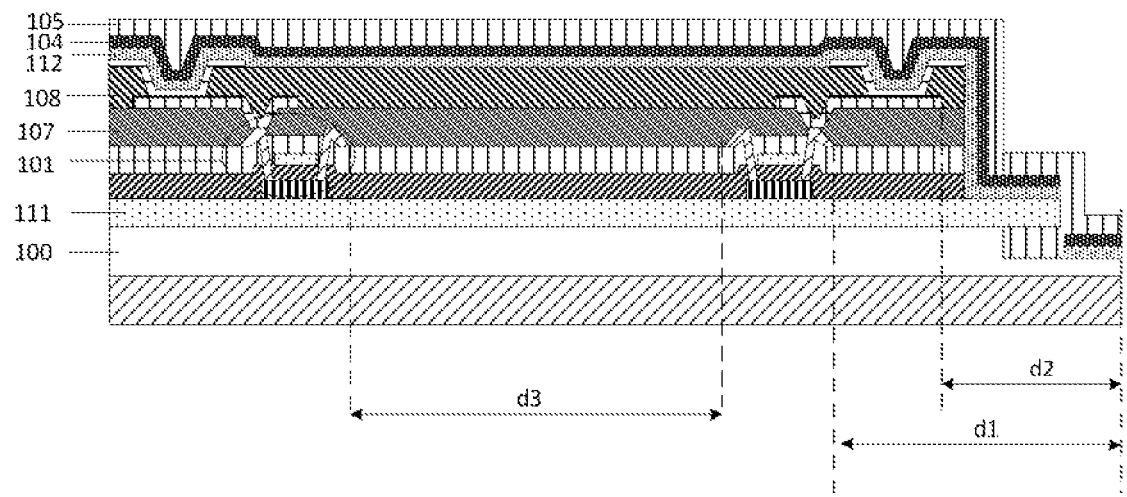
FIG. 11 is a schematic structural diagram of another display panel according to an embodiment of the disclosure in a sectional view.

In a real process of fabricating the display panel, the positions at which to arrange hardware structures, and the sizes and shapes of installation holes to be formed are determined according to a product for which the display panel is to be fabricated. For an area in which to form an installation hole, firstly a blind hole (corresponding to the first base substrate) is formed in the base substrate, then a TFT structure, the light-emitting layer, the anode layer, or other structures may not be arranged in the blind hole area; the installation hole should not to influence the display effect of the display panel as much as possible. In some embodiments, see FIG. 11, there is a preset distances d1 between the edge of the installation hole and an adjacent TFT structure 101, and a preset distance d2 between the edge of the installation hole and the anode layer, and both of the preset distances d1 and d2 are no more than the distance d3 between adjacent sub-pixels. There is d1 distance between the edge of the installation hole, and the closest TFT structure, and there is d2 distance between the edge of the installation hole and the closest anode layer, and in order not to influence the normal display of the display panel, these distances d1 and d2 shall not be more than the spacing d3 between adjacent sub-pixels.

In some embodiments, the hardware structure includes one or more of a front camera, a button, a headphone, or a loudspeaker. The hardware structure will not be limited to any specific installation scheme, although the embodiment of the disclosure will not be limited thereto. Furthermore in order to form the installation hole, the shape of the installation hole to be formed can be determined according to the hardware structure to be installed, and the installation hole can be different shapes for the different hardware structure. In some embodiments, the shape of a section of the installation hole in the direction parallel to the base substrate can be one or more of the following shapes: a circle, an ellipse, a rectangle, a trapezium, a diamond, or a square.

In a specific implementation, the structure of the encapsulation layer above may not be limited to any specific structure. For example, the encapsulation layer can be arranged in a structure of three layers stacked, i.e., a first inorganic layer, a second organic layer, and a third inorganic layer. Of course, the encapsulation layer can alternatively be arranged in more layers stacked. The inorganic layer in the encapsulation layer can be silicon nitride, silicon oxynitride, silicon oxide, and alumina; and the organic layer in the encapsulation layer can be Acrylic, epoxy resin, and an organic compound including silicon.

In some embodiments, the base substrate is flexible substrate. For example, the base substrate can be PI substrate.

Figure 12:
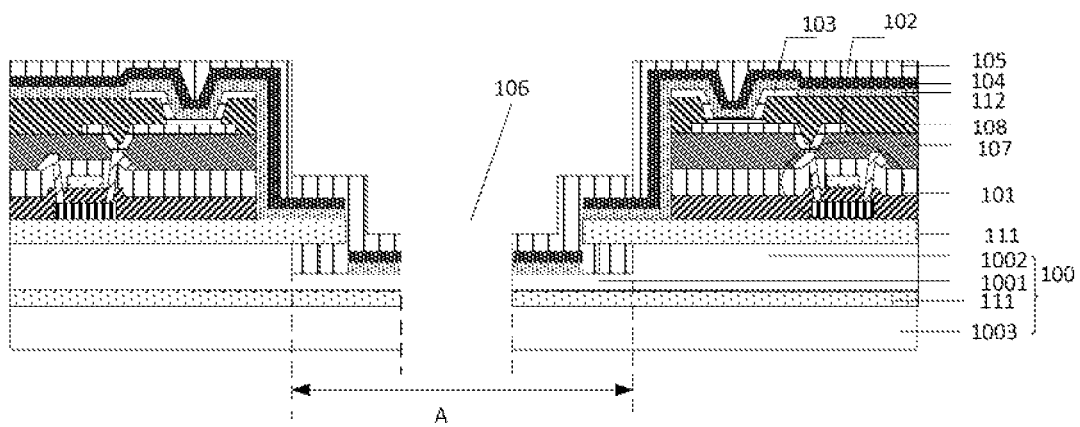
FIG. 12 is a schematic structural diagram of another display panel according to an embodiment of the disclosure in a sectional view.

In some embodiments, see FIG. 12, the base substrate 100 includes two layers of PI substrate, the first layer of PI substrate 1001 or 1002, and the second layer of PI substrate 1003, and a barrier layer 111 is arranged between the two layers of PI substrates.

Based upon the same inventive idea, an embodiment of the disclosure further provides a display device including the display panel above according to any one of the embodiments above of the disclosure. Reference can be made to the display panel according to any one of the embodiments above of the disclosure for an implementation of the display device, so a repeated description thereof will be omitted here.

Figure 9:
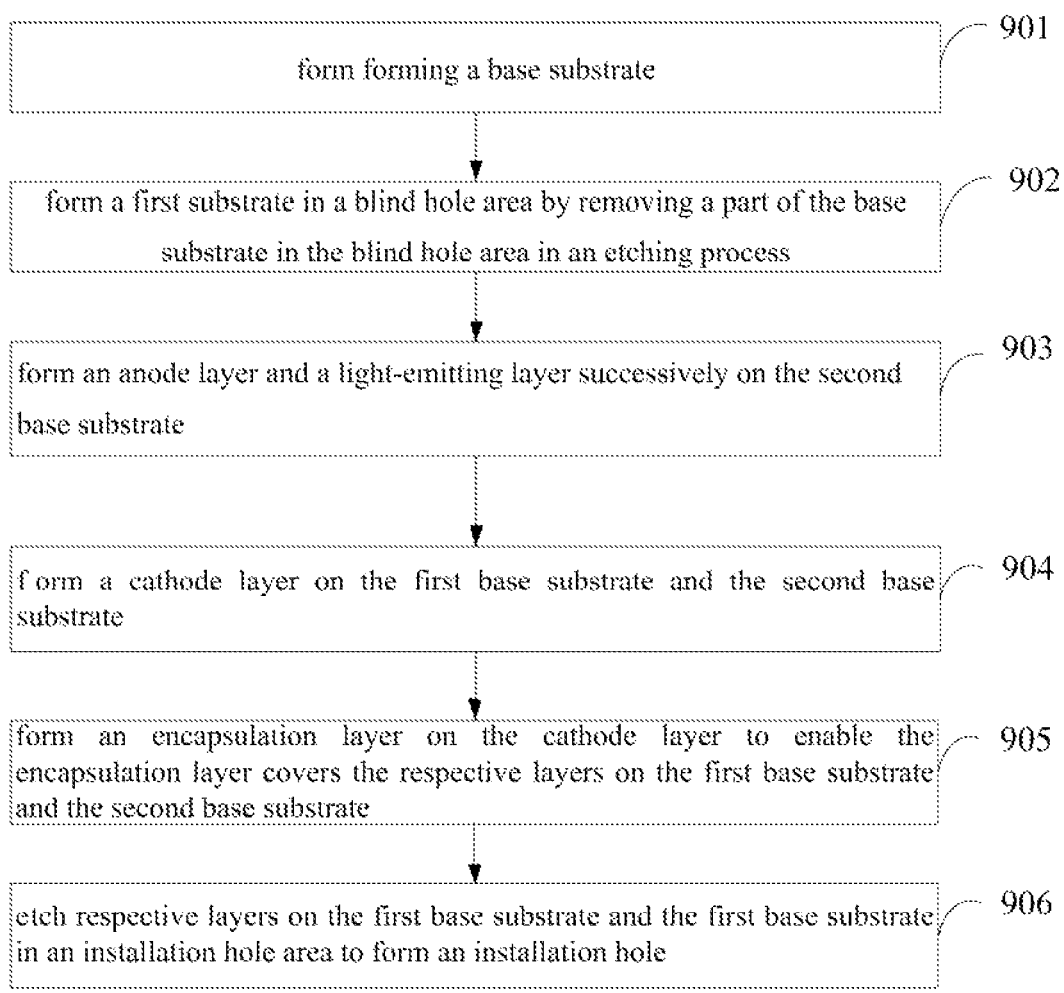
FIG. 9 is a flow chart of steps in a method for fabricating a display panel according to an embodiment of the disclosure.

Based upon the same inventive idea, an embodiment of the disclosure further provides another method for fabricating a display panel, which is the display panel above according to any one of the embodiments above of the disclosure. As illustrated in FIG. 9 which is a flow chart of steps in a method for fabricating a display panel, the method can include the following steps.

Step 901: forming a base substrate.

Step 902: forming a first substrate in a blind hole area by removing a part of the base substrate in the blind hole area in an etching process, wherein the base substrate in an area other than the blind hole is the second base substrate, and the thickness of the first base substrate is smaller than the thickness of the second base substrate.

Step 903: forming an anode layer and a light-emitting layer successively on the second base substrate.

Step 904: forming a cathode layer on the first base substrate and the second base substrate, wherein the cathode layer on the first base substrate is disconnected from the cathode layer on the second base substrate.

Step 905: forming an encapsulation layer on the cathode layer to enable the encapsulation layer covers the respective layers on the first base substrate and the second base substrate, wherein the encapsulation layer on the first base substrate and the encapsulation layer on the second base substrate are continuous.

Step 906: etching respective layers on the first base substrate and the first base substrate in an installation hole area in a direction perpendicular to the base substrate to form an installation hole for installing a hardware structure.

The orthographic projection of the installation hole on the first base substrate lies within the blind hole area.

In some embodiments, before forming an anode layer on the second base substrate, the method further includes: forming a thin film transistor structure on the second base substrate.

In some embodiments, before forming a cathode layer, the method further includes: forming a function layer on the first base substrate and second base substrate. The function layer on the first base substrate is disconnected from the function layer on the second base substrate.

In some embodiments, after the thin film transistor is formed, and before the cathode layer is formed, the method further includes: forming a planarization layer on the thin film transistor structure; forming a via hole for connecting the anode layer with the thin film transistor structure and removing the planarization layer in the first area in one patterning process, to form a pattern of the planarization layer; and forming patterns of the anode layer and a pixel definition layer successively on the planarization layer. The encapsulation layer covers the planarization layer and the pixel definition layer in the direction parallel to the base substrate.

In some embodiments, the step 901 of forming a first base substrate in a blind hole area by removing a part of the base substrate in the blind hole area in an etching process includes: depositing a barrier layer on the base substrate; forming a first base substrate in a blind hole area by removing the barrier layer and a part of the base substrate in the blind hole area in an etching process.

Referring to FIGS. 10A-10F, the fabricating method of the display panel in FIG. 8 are described in details.

Figure 10A:
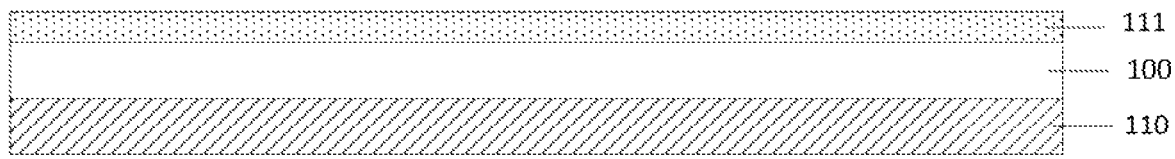
FIG. 10A to FIG. 10F are schematic structural diagrams after the respective steps according to the embodiment of the disclosure.

In FIG. 10A, the base substrate 100 is formed on the glass substrate 110, and the barrier layer 111 is deposited on the base substrate 100. The base substrate is for example PI substrate.

Figure 10B:
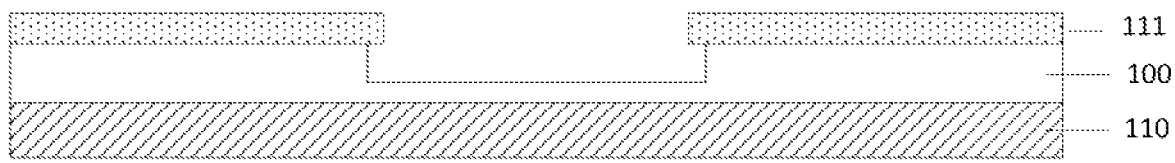

In FIG. 10B, the base substrate 100 is dry-etched using the barrier layer as hard mask to form the blind hole area with an undercut structure on the sidewall in the base substrate. The blind hole area means that the base substrate in this area is not penetrated, and a part of the base substrate remains in the blind hole area. The base substrate in the blind hole area A is the first base substrate, and the base substrate in the area other than the blind hole area is the second base substrate. Of course, the first base substrate 1001 in the blind hole area can formed in another process, and the disclosure will not be limited thereto. The thickness of the first base substrate 1001 is smaller than the thickness of the second base substrate 1002.

Figure 10C:
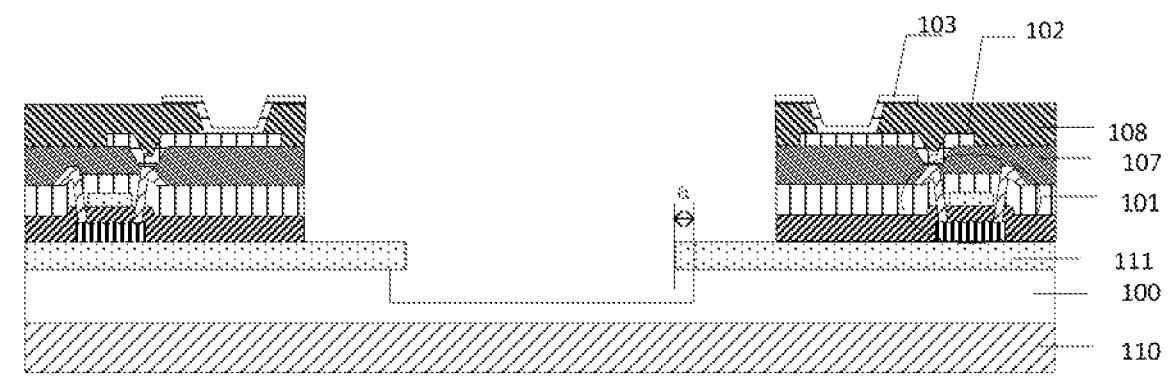

In FIG. 10C, the TFT structure 101, the anode layer 102 and the light-emitting layer 103 are formed on the second base substrate 1002. In some embodiments, other layers, e.g., a passivation layer, a planarization layer, etc., shall be formed on the second base substrate; and all of these structures are common in the display panel; and since they are not a focus of the disclosure, a detailed description thereof will be omitted here. The embodiment of the disclosure will not be limited to any specific process for forming the TFT structure, the anode layer, the light-emitting layer, and the cathode layer on the flexible substrate, but an appropriate process can be selected as needed.

Figure 10D:
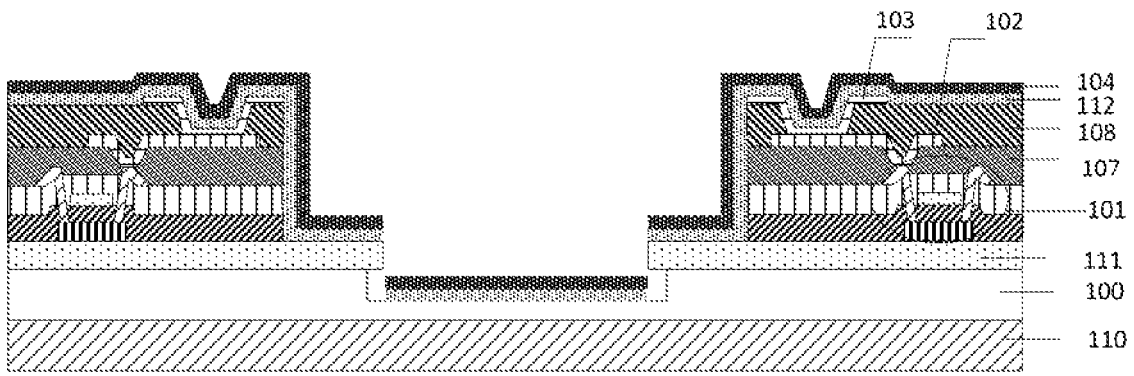

In FIG. 10D, the function layer 112 and cathode layer 104 are evaporated on the first base substrate and the second base substrate. The function layer 112 and cathode layer 104 on the first base substrate are disconnected from the function layer 112 and cathode layer 104 on the second base substrate. The function layer 112 may include: hole transport layer, hole injection layer, electron transport layer, electron injection layer and so on.

Figure 10E:
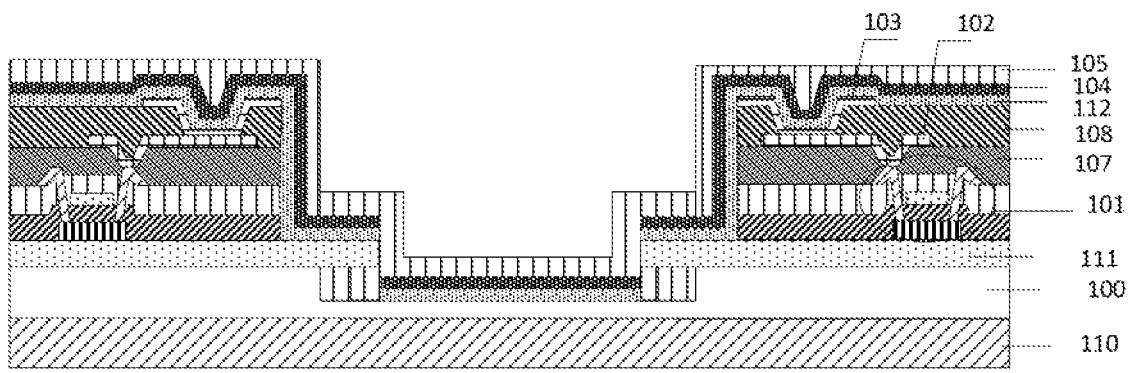

In FIG. 10E, the encapsulation layer 105 is formed on the cathode layer to enable the encapsulation layer covers the respectively layers on the first base substrate and the second base substrate. The encapsulation layer on the first base substrate and on the second base substrate is continuous.

Figure 10F:
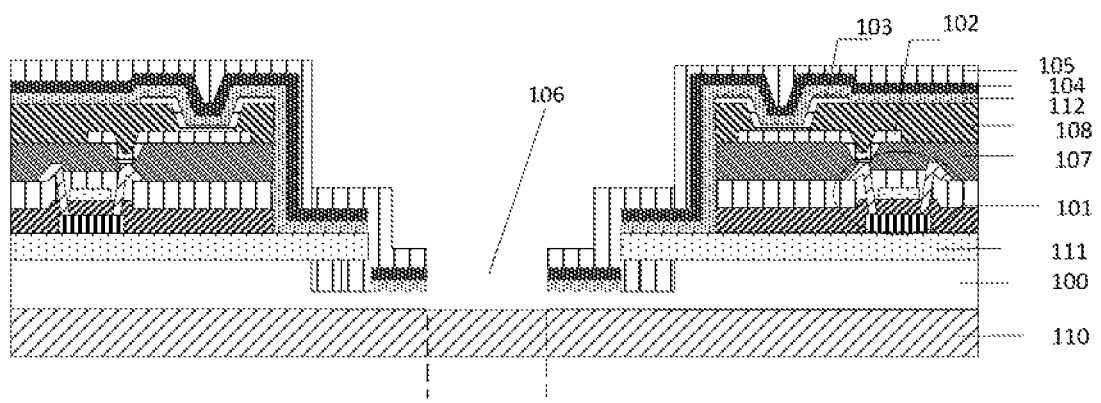

In FIG. 10F, the function layer 112, cathode layer 104 and encapsulation layer 105 in the installation hole area on the first base substrate are etched, and further the first base substrate in the installation hole area is also etched to from an installation hole 106 for installing a hardware structure. The orthographic projection of the installation hole on the first base substrate lies within the blind hole area; and the installation hole is within the display area of the display panel.

In the display panel and the fabricating method thereof according to the embodiments of the disclosure, the encapsulation layer 105 covers the respective layers on the second base substrate, thus can protect the cathode layer and the light-emitting layer on the second base substrate from being oxidized by ambient water and oxygen, and improve the reliability at the position of the installation hole. Since the thickness of the first base substrate is smaller than the thickness of the second base substrate, the function layer and cathode layer on the first base substrate are disconnected from the function layer and cathode layer on the second cathode layer, which can further protect the cathode layer on the second base substrate from oxidized by ambient water and oxygen.

In summary, in the display panel, the method for fabricating the same, and the display device according to the embodiments of the disclosure, the installation hole can be arranged in the display area of the display panel to thereby narrow the bezel, and increase the valid size of the display area so as to fabricate the all-screen display panel. The encapsulation layer material can be arranged on the edge of the installation hole, and since the encapsulation layer material covers the light-emitting layer and the cathode layer adjacent to the edge of the installation hole in the direction parallel to the base substrate, it can protect the light-emitting layer and the cathode layer from being oxidized by ambient water and oxygen, thus improving the reliability at the position of the installation hole.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
a base substrate comprising a first base substrate in a blind hole area and a second base substrate in an area other than the blind hole area, wherein a thickness of the first base substrate is smaller than a thickness of the second base substrate;
an anode layer, a light-emitting layer, a cathode layer, and an encapsulation layer arranged successively on the second base substrate, and the cathode layer and the encapsulation layer arranged successively on the first base substrate;
wherein at least one installation hole for installing a hardware structure is arranged in a display area of the display panel, the at least one installation hole is within the blind hole area, and the at least one installation hole runs through the first base substrate and respective layers on the first base substrate in a direction perpendicular to the base substrate; and
wherein the encapsulation layer on the first base substrate and the encapsulation layer on the second base substrate are continuous, and the cathode layer on the first base substrate is disconnected from the cathode layer on the second base substrate;
the encapsulation layer covers the respective layers on the first base substrate and the second base substrate.

2. The display panel according to claim 1, further comprising a thin film transistor structure between the anode layer and the second base substrate, wherein the encapsulation layer covers the thin film transistor structure on the second base substrate.

3. The display panel according to claim 2, further comprising a planarization layer arranged between the thin film transistor structure and the anode layer, and a pixel definition layer arranged between the anode layer and the light-emitting layer on the second base substrate;
wherein the encapsulation layer covers the planarization layer and the pixel definition layer on the second base substrate.

4. The display panel according to claim 2, further comprising a barrier layer arranged on the second base substrate, wherein the barrier layer is between the second base substrate and the thin film transistor structure, and the encapsulation layer covers the barrier layer.

5. The display panel according to claim 4, wherein a boundary of the barrier layer close to the first base substrate is beyond a boundary between the second base substrate and the first base substrate, the barrier layer at least partially overlaps with the first base substrate, and the cathode layer and the encapsulation layer are arranged on an overlapped area of the barrier layer with the first base substrate.

6. The display panel according to claim 5, wherein the encapsulation layer and the cathode layer cover side surface of the respective layers on the barrier layer of the second base substrate, and the encapsulation layer covers the side surface of the second base substrate.

7. The display panel according to claim 6, wherein the encapsulation layer covers side surface of the barrier layer and the cathode layer on the overlapped area between the barrier layer and first base substrate and doesn't cover the side surface of the first base substrate.

8. The display panel according to claim 1, further comprising a function layer between the cathode layer and light-emitting layer on the second base substrate, and between the cathode layer and the first base substrate, wherein the function layer on the first base substrate is disconnected from the function layer on the second base substrate, wherein the encapsulation layer covers the function layer on the first base substrate and the second base substrate.

9. The display panel according to claim 1, wherein a distance between the edge of the installation hole and the thin film transistor structure adjacent thereto is no more than a distance between adjacent sub-pixels, and a distance between the edge of the installation hole and the anode layer adjacent thereto is no more than the distance between adjacent sub-pixels.

10. The display panel according to claim 1, wherein a shape of a section of the installation hole in the direction parallel to the base substrate is one or more of:
a circle, an ellipse, a rectangle, a trapezium, a diamond, or a square.

11. The display panel according to claim 1, wherein the hardware structure comprises one or more of:
a front camera, a button, a headphone, or a loudspeaker.

12. The display panel according to claim 1, wherein the encapsulation layer includes organic layer and inorganic layer.

13. The display panel according to claim 1, wherein the base substrate is a flexible substrate.

14. A display device, comprising the display panel according to claim 1.

15. A method for fabricating the display panel according to claim 1, the method comprising:
forming a base substrate;
forming a first base substrate in a blind hole area by removing a part of the base substrate in the blind hole area in an etching process, wherein the base substrate in an area other than the blind hole area is a second base substrate, a thickness of the first base substrate is smaller than a thickness of the second base substrate;
forming an anode layer and a light-emitting layer successively on the second base substrate;
forming a cathode layer on the first base substrate and the second base substrate, wherein the cathode layer on the first base substrate is disconnected from the cathode layer on the second base substrate;
forming an encapsulation layer on the cathode layer to enable the encapsulation layer to cover respective layers on the first base substrate and the second base substrate, wherein the encapsulation layer on the first base substrate and the encapsulation layer on the second base substrate are continuous; and
etching the respective layers on the first base substrate and the first base substrate in an installation hole area in a direction perpendicular to the base substrate to form an installation hole for installing a hardware structure;
wherein an orthographic projection of the installation hole on the first base substrate lies within the blind hole area.

16. The method according to claim 15, further comprising:
forming a thin film transistor structure on the second base substrate.

17. The method according to claim 16, wherein after the thin film transistor structure is formed, and before the cathode layer is formed, the method further comprises:
forming a planarization layer on the thin film transistor structure;
forming a via hole for connecting the anode layer with the thin film transistor structure and removing the planarization layer in the first area in one patterning process, to form a pattern of the planarization layer; and
forming patterns of the anode layer and a pixel definition layer successively on the planarization layer;
wherein the encapsulation layer covers the planarization layer and the pixel definition layer.

18. The method according to claim 15, wherein said forming a first base substrate in a blind hole area by removing a part of the base substrate in the blind hole area in an etching process comprises:
depositing a barrier layer on the base substrate;
forming a first base substrate in a blind hole area by removing the barrier layer and a part of the base substrate in the blind hole area in an etching process.

* * * * *